US006894304B2

(12) United States Patent
Moore

(10) Patent No.: US 6,894,304 B2
(45) Date of Patent: May 17, 2005

(54) APPARATUS AND METHOD FOR DUAL CELL COMMON ELECTRODE PCRAM MEMORY DEVICE

(75) Inventor: John Moore, Boise, ID (US)

(73) Assignee: Micron Technology, Inc., Boise, ID (US)

(*) Notice: Subject to any disclaimer, the term of this patent is extended or adjusted under 35 U.S.C. 154(b) by 173 days.

(21) Appl. No.: 10/369,621

(22) Filed: Feb. 21, 2003

(65) Prior Publication Data

US 2003/0222280 A1 Dec. 4, 2003

Related U.S. Application Data

(62) Division of application No. 09/938,672, filed on Aug. 27, 2001, now Pat. No. 6,737,312.

(51) Int. Cl.[7] .......................... H01L 45/00; H01L 27/02; H01L 21/8239; H01L 31/0328
(52) U.S. Cl. ..................... 257/4; 257/2; 257/3; 257/5; 257/295; 257/310; 257/758
(58) Field of Search ................................ 257/295, 310

(56) References Cited

U.S. PATENT DOCUMENTS

| | | | |
|---|---|---|---|
| 3,271,591 A | 8/1966 | Ovishinsky | 257/15 |
| 3,622,319 A | 11/1971 | Sharp | 257/444 |
| 3,743,847 A | 7/1973 | Boland | 398/200 |

(Continued)

FOREIGN PATENT DOCUMENTS

| | | | | |
|---|---|---|---|---|
| JP | 56126916 | 10/1981 | | |
| WO | WO 97/48032 | 12/1997 | | 368/468 |
| WO | WO 99/28914 | 6/1999 | | 257/438 |
| WO | WO 00/48196 | 8/2000 | | 385/16 |
| WO | WO 02/21542 | 3/2002 | | 365/13 |

OTHER PUBLICATIONS

Axon Technologies Corporation, Technology Description: *Programmable Metalization Cell(PMC)*, pp. 1–6 (Pre–May 2000).

Helbert et al., *Intralevel hybrid resist process with submicron capability*, SPIE vol. 333 Submicron Lithography, pp. 24–29 (1982).

Hilt, Dissertation: *Materials characterization of Silver Chalcogenide Programmable Metalization Cells*, Arizona State University, pp. Title page–114 (UMI Company, May 1999).

Hirose et al., *High Speed Memory Behavior and Reliability of an Amorphous $As_2S_3$ Film Doped Ag*, Phys. Stat. Sol. (a) 61, pp. 87–90 (1980).

Holmquist et al., *Reaction and Diffusion in Silver–Arsenic Chalcogenide Glass Systems*, 62 J. Amer. Ceram. Soc., No. 3–4, pp. 183–188 (Mar.–Apr. 1979).

Huggett et al., *Development of silver sensitized germanium selenide photoresist by reactive sputter etching in $SF_6$* 42 Appl. Phys. Lett., No. 7, pp. 592–594 (Apr. 1983).

Kawaguchi et al., *Mechanism of photosurface deposition*, 164–166 J. Non–Cryst. Solids, pp. 1231–1234 (1993).

Kolobov and Elliott, Photodoping of Amorphous Chalcogenides by Metals, Advances in Physics, vol. 40, No. 5, 625–684 (1991).

(Continued)

*Primary Examiner*—Tom Thomas
*Assistant Examiner*—Jesse A. Fenty
(74) *Attorney, Agent, or Firm*—Dickstein Shapiro Morin & Oshinsky LLP

(57) ABSTRACT

Two PCRAM cells which use a common anode between them are disclosed. The two memory cells can be accessed separately to store two bits of data which can be read and written, and can be stacked one over the other with a common anode between them to form an upper and lower cell pair. Respective access transistors are provided for the cells and arranged to permit reading and writing of the cells.

32 Claims, 8 Drawing Sheets

U.S. PATENT DOCUMENTS

| | | | | |
|---|---|---|---|---|
| 3,961,314 | A | 6/1976 | Klose et al. | 257/427 |
| 3,966,317 | A | 6/1976 | Wacks et al. | 438/102 |
| 3,988,720 | A | 10/1976 | Ovshinsky | 365/163 |
| 3,983,542 | A | 11/1976 | Ovshinsky | 438/957 |
| 4,177,474 | A | 12/1979 | Ovshinsky | 365/175 |
| 4,267,261 | A | 5/1981 | Hallman et al. | 708/200 |
| 4,269,935 | A | 5/1981 | Masters et al. | 438/618 |
| 4,312,938 | A | 1/1982 | Drexler et al. | 438/122 |
| 4,316,946 | A | 2/1982 | Masters et al. | 257/420 |
| 4,320,191 | A | 3/1982 | Yoshikawa et al. | 438/257 |
| 4,405,710 | A | 9/1983 | Balasubramanyam et al. | 438/466 |
| 4,419,421 | A | 12/1983 | Wichelhaus et al. | 368/468 |
| 4,499,557 | A | 2/1985 | Holmberg et al. | 257/462 |
| 4,597,162 | A | 7/1986 | Johnson et al. | 438/257 |
| 4,608,296 | A | 8/1986 | Keem et al. | 257/529 |
| 4,637,895 | A | 1/1987 | Ovshinsky et al. | 438/618 |
| 4,646,266 | A | 2/1987 | Ovshinsky et al. | 438/95 |
| 4,664,939 | A | 5/1987 | Ovshinsky | 708/200 |
| 4,668,968 | A | 5/1987 | Ovshinsky et al. | 257/213 |
| 4,670,763 | A | 6/1987 | Ovshinsky et al. | 438/466 |
| 4,671,618 | A | 6/1987 | Wu et al. | 438/257 |
| 4,673,957 | A | 6/1987 | Ovshinsky et al. | 363/171 |
| 4,678,679 | A | 7/1987 | Ovshinsky | 365/120 |
| 4,696,758 | A | 9/1987 | Ovshinsky et al. | 438/213 |
| 4,698,234 | A | 10/1987 | Ovshinsky et al. | 438/257 |
| 4,710,899 | A | 12/1987 | Young et al. | 257/262 |
| 4,728,406 | A | 3/1988 | Banerjee et al. | 257/420 |
| 4,737,379 | A | 4/1988 | Hudgens et al. | 365/129 |
| 4,766,471 | A | 8/1988 | Ovshinsky et al. | 438/618 |
| 4,769,338 | A | 9/1988 | Ovshinsky et al. | 257/528 |
| 4,775,425 | A | 10/1988 | Guha et al. | 438/102 |
| 4,788,594 | A | 11/1988 | Ovshinsky et al. | 365/129 |
| 4,795,657 | A | 1/1989 | Formigoni et al. | 398/200 |
| 4,800,526 | A | 1/1989 | Lewis | 365/150 |
| 4,809,044 | A | 2/1989 | Pryor et al. | 438/618 |
| 4,818,717 | A | 4/1989 | Johnson et al. | 365/129 |
| 4,843,443 | A | 6/1989 | Ovshinsky et al. | 365/150 |
| 4,845,533 | A | 7/1989 | Pryor et al. | 257/458 |
| 4,847,674 | A | 7/1989 | Silwa et al. | 438/642 |
| 4,853,785 | A | 8/1989 | Ovshinsky et al. | 257/213 |
| 4,891,330 | A | 1/1990 | Guha et al. | 708/943 |
| 5,128,099 | A | 7/1992 | Strand et al. | 708/200 |
| 5,159,661 | A | 10/1992 | Ovshinsky et al. | 365/13 |
| 5,166,758 | A | 11/1992 | Ovshinsky et al. | 385/16 |
| 5,177,567 | A * | 1/1993 | Klersy et al. | 257/4 |
| 5,219,788 | A | 6/1993 | Abernathey et al. | 708/426 |
| 5,238,862 | A | 8/1993 | Blalock et al. | 438/95 |
| 5,272,359 | A | 12/1993 | Nagasubramanian et al. | 365/129 |
| 5,296,716 | A | 3/1994 | Ovshinsky et al. | 257/15 |
| 5,314,772 | A | 5/1994 | Kozicki | 438/257 |
| 5,315,131 | A | 5/1994 | Kishimoto et al. | 708/493 |
| 5,335,219 | A | 8/1994 | Ovshinsky et al. | 708/493 |
| 5,341,328 | A | 8/1994 | Ovshinsky et al. | 438/666 |
| 5,350,484 | A | 9/1994 | Gardner et al. | 365/179 |
| 5,359,205 | A | 10/1994 | Ovshinsky | 438/102 |
| 5,360,981 | A | 11/1994 | Owen et al. | 398/420 |
| 5,406,509 | A | 4/1995 | Ovshinsky et al. | 708/200 |
| 5,414,271 | A | 5/1995 | Ovshinsky et al. | 257/4 |
| 5,500,532 | A | 3/1996 | Kozicki et al. | 438/618 |
| 5,512,328 | A | 4/1996 | Yoshimura et al. | 257/213 |
| 5,512,773 | A | 4/1996 | Wolf et al. | 257/296 |
| 5,534,711 | A | 7/1996 | Ovshinsky et al. | 257/5 |
| 5,534,712 | A | 7/1996 | Ovshinsky et al. | 438/618 |
| 5,536,947 | A | 7/1996 | Klersy et al. | 438/213 |
| 5,543,737 | A | 8/1996 | Ovshinsky | 365/129 |
| 5,596,522 | A | 1/1997 | Ovshinsky et al. | 428/251 |
| 6,591,501 | B1 | 1/1997 | Ovshinsky et al. | 365/171 |
| 5,687,112 | A | 11/1997 | Ovshinsky | 438/262 |
| 5,694,054 | A | 12/1997 | Ovshinsky et al. | 257/213 |
| 5,714,768 | A | 2/1998 | Ovshinsky et al. | 398/420 |
| 5,726,083 | A | 3/1998 | Takaishi | 257/310 |
| 5,751,012 | A | 5/1998 | Wolstenholme et al. | 398/200 |
| 5,761,115 | A | 6/1998 | Kozicki et al. | 438/257 |
| 5,789,277 | A | 8/1998 | Zahorik et al. | 438/666 |
| 5,825,046 | A | 10/1998 | Czubatyj et al. | 365/179 |
| 5,841,150 | A | 11/1998 | Gonzalez et al. | 438/466 |
| 5,846,889 | A | 12/1998 | Harbison et al. | 385/16 |
| 5,896,312 | A | 4/1999 | Kozicki et al. | 257/296 |
| 5,912,839 | A | 6/1999 | Ovshinsky et al. | 424/646 |
| 5,914,893 | A | 6/1999 | Kozicki et al. | 438/4 |
| 5,920,788 | A | 7/1999 | Reinberg | 257/14 |
| 5,933,365 | A | 8/1999 | Klersy et al. | 438/618 |
| 5,998,066 | A | 12/1999 | Block et al. | 365/129 |
| 6,011,757 | A | 1/2000 | Ovshinsky | 365/163 |
| 6,015,977 | A | 1/2000 | Zahorik | 257/438 |
| 6,072,716 | A | 6/2000 | Jacobson et al. | 438/102 |
| 6,077,729 | A | 6/2000 | Harshfield | 365/171 |
| 6,084,796 | A | 7/2000 | Kozicki et al. | 257/15 |
| 6,087,674 | A | 7/2000 | Ovshinsky et al. | 386/18 |
| 6,117,720 | A | 9/2000 | Harshfield | 257/438 |
| 6,141,241 | A | 10/2000 | Ovshinsky et al. | 438/666 |
| 6,143,604 | A | 11/2000 | Chiang et al. | 424/646 |
| 6,177,338 | B1 | 1/2001 | Liaw et al. | 428/251 |
| 6,236,059 | B1 | 5/2001 | Wolstenholme et al. | 438/618 |
| RE37,259 | E | 7/2001 | Ovshinsky | 438/618 |
| 6,297,170 | B1 | 10/2001 | Gabriel et al. | 365/171 |
| 6,300,684 | B1 | 10/2001 | Gonzalez et al. | 365/120 |
| 6,316,784 | B1 | 11/2001 | Zahorik et al. | 438/102 |
| 6,329,606 | B1 | 12/2001 | Freyman et al. | 365/129 |
| 6,339,544 | B1 | 1/2002 | Chiang et al. | 708/493 |
| 6,348,365 | B1 | 2/2002 | Moore et al. | 365/175 |
| 6,350,679 | B1 | 2/2002 | McDaniel et al. | 438/213 |
| 6,376,284 | B1 | 4/2002 | Gonzalez et al. | 257/528 |
| 6,388,324 | B2 | 5/2002 | Kozicki et al. | 708/493 |
| 6,391,688 | B1 | 5/2002 | Gonzalez et al. | 438/257 |
| 6,404,665 | B1 | 6/2002 | Lowery et al. | 257/296 |
| 6,414,376 | B1 | 7/2002 | Thakur et al. | 257/532 |
| 6,418,049 | B1 | 7/2002 | Kozicki et al. | 365/129 |
| 6,423,628 | B1 | 7/2002 | Li et al. | 438/213 |
| 6,426,891 | B1 | 7/2002 | Katori | 708/200 |
| 6,429,064 | B1 | 8/2002 | Wicker | 257/4 |
| 6,437,383 | B1 | 8/2002 | Xu | 257/5 |
| 6,462,984 | B1 | 10/2002 | Xu et al. | 365/175 |
| 6,473,332 | B1 | 10/2002 | Ignatiev et al. | |
| 6,480,438 | B1 | 11/2002 | Park | 438/200 |
| 6,487,106 | B1 | 11/2002 | Kozicki | 257/528 |
| 6,487,113 | B1 | 11/2002 | Park et al. | 257/4 |
| 6,501,111 | B1 | 12/2002 | Lowery | 438/618 |
| 6,507,061 | B1 | 1/2003 | Hudgens et al. | 438/95 |
| 6,511,862 | B2 | 1/2003 | Hudgens et al. | 257/5 |
| 6,511,867 | B2 | 1/2003 | Lowery et al. | 368/468 |
| 6,512,241 | B1 | 1/2003 | Lai | 438/257 |
| 6,512,405 | B2 | 2/2003 | Xu et al. | 257/296 |
| 6,531,373 | B2 | 3/2003 | Gill et al. | 385/16 |
| 6,534,781 | B2 | 3/2003 | Dennison | 438/102 |
| 6,545,287 | B2 | 4/2003 | Chiang | 438/466 |
| 6,545,907 | B1 | 4/2003 | Lowery et al. | 257/310 |
| 6,555,860 | B2 | 4/2003 | Lowery et al. | 438/466 |
| 6,563,164 | B2 | 5/2003 | Lowery et al. | 257/310 |
| 6,566,700 | B2 | 5/2003 | Xu | 385/16 |
| 6,567,293 | B1 | 5/2003 | Lowery et al. | 257/14 |
| 6,569,705 | B2 | 5/2003 | Chiang et al. | 438/957 |
| 6,570,784 | B2 | 5/2003 | Lowery | 365/163 |
| 6,576,921 | B2 | 6/2003 | Lowery | 708/200 |
| 6,586,761 | B2 | 7/2003 | Lowery | 257/438 |
| 6,589,714 | B2 | 7/2003 | Malmon et al. | 365/175 |
| 6,590,807 | B2 | 7/2003 | Lowery | 438/200 |
| 6,593,176 | B2 | 7/2003 | Dennison | 257/4 |
| 6,597,009 | B2 | 7/2003 | Wicker | 438/618 |

| | | |
|---|---|---|
| 6,605,527 B2 | 8/2003 | Dennison et al. .............. 438/95 |
| 6,613,604 B2 | 9/2003 | Maimon et al. ................ 257/5 |
| 6,621,095 B2 | 9/2003 | Chiang et al. ............... 365/148 |
| 6,625,054 B2 | 9/2003 | Lowery et al. .............. 438/257 |
| 6,642,102 B2 | 11/2003 | Xu ............................. 257/296 |
| 6,646,297 B2 | 11/2003 | Dennison ....................... 257/4 |
| 6,649,928 B2 | 11/2003 | Dennison .................... 365/171 |
| 6,667,900 B2 | 12/2003 | Lowery et al. .............. 438/200 |
| 6,671,710 B2 | 12/2003 | Ovshinsky et al. .......... 708/493 |
| 6,673,648 B2 | 1/2004 | Lowrey ....................... 438/102 |
| 6,673,700 B2 | 1/2004 | Dennison et al. ........... 438/466 |
| 6,674,115 B2 | 1/2004 | Hudgens et al. ............ 257/310 |
| 6,687,153 B2 | 2/2004 | Lowery ....................... 365/163 |
| 6,687,427 B2 | 2/2004 | Ramalingam et al. ........ 385/16 |
| 6,690,026 B2 | 2/2004 | Peterson ........................ 257/4 |
| 6,696,355 B2 | 2/2004 | Dennison .................... 438/957 |
| 6,707,712 B2 | 3/2004 | Lowery ....................... 365/175 |
| 6,714,954 B2 | 3/2004 | Ovshinsky et al. ......... 708/200 |
| 6,737,312 B2 * | 5/2004 | Moore ........................ 438/238 |
| 2002/0000666 A1 | 1/2002 | Kozicki et al. .............. 438/102 |
| 2002/0072188 A1 | 6/2002 | Gilton ......................... 708/200 |
| 2002/0106849 A1 | 8/2002 | Moore ......................... 438/213 |
| 2002/0123169 A1 | 9/2002 | Moore et al. ................. 438/95 |
| 2002/0123170 A1 | 9/2002 | Moore et al. ............... 365/129 |
| 2002/0123248 A1 | 9/2002 | Moore et al. ............... 438/795 |
| 2002/0127886 A1 | 9/2002 | Moore et al. ............... 438/102 |
| 2002/0163828 A1 | 11/2002 | Krieger et al. .............. 438/618 |
| 2002/0168820 A1 | 11/2002 | Kozicki ....................... 438/259 |
| 2002/0190350 A1 | 12/2002 | Kozicki ....................... 257/532 |
| 2003/0001229 A1 | 1/2003 | Moore et al. ............... 257/528 |
| 2003/0027416 A1 | 2/2003 | Moore ......................... 438/618 |
| 2003/0035314 A1 | 2/2003 | Kozicki ....................... 365/171 |
| 2003/0035315 A1 | 2/2003 | Kozicki ....................... 257/438 |
| 2003/0048744 A1 | 3/2003 | Ovshinsky et al. ......... 708/940 |
| 2003/0212724 A1 | 11/2003 | Ovshinsky et al. ...... 369/275.2 |
| 2003/0212725 A1 | 11/2003 | Ovshinsky et al. ......... 305/175 |
| 2004/0007718 A1 * | 1/2004 | Campbell .................... 257/200 |
| 2004/0035401 A1 | 2/2004 | Ramachandran et al. ... 708/490 |
| 2004/0042259 A1 * | 3/2004 | Campbell et al. ........... 365/158 |

OTHER PUBLICATIONS

Kozicki, et al., "Applications of Programmable Resistance Changes in Metal–doped Chalcogenides", Proceedings of the 1999 Symposium on Solid State Ionic Devices, Editors–E.D. Wachsman et al., The Electromechanical Society, Inc., 1–12 (1999).

Kozicki, et al., *Nanoscale effects in devices based on chalcogenide solid solutions*, Superlattices and Microstructures, 27, 485–488 (2000).

Kozicki, et al., *Nanoscale phase separation in Ag–Ge–Se glasses*, Microelectronic Engineering, vol. 63/1–3, 155–159 (2002).

M.N. Kozicki and M. Mitkova, *Silver incorporation in thin films of selenium rich Ge–Se glasses*, Proceedings of the XIX International Congress on Glass, Society for Glass Technology, 226–227 (2001).

McHardy et al., *The dissolution of metals in amorphous chalcogenides and the effects o electron and ultraviolet radiation*, 20 J. Phys. C.: Solid State Phys., pp. 4055–4075 (1987).

Owen et al., *Metal–Chalcogenide Photoresists for High Resolution Lithography and Sub–Micron Structures*, Nanostructure Physics and Fabrication, pp. 447–451 (M. Reed ed. 1989).

Shimizu et al., *The Photo–Erasable Memory Switching Effect of Ag Photo–Doped Chalcogenide Glasses*, 46 B. Chem Soc. Japan, No. 12, pp. 3662–3365 (1973).

Abdel–All, A.; Elshafie,A.; Elhawary, M.M., DC electric–field effect in bulk and thin–film Ge5As38Te57 chalcogenide glass, Vacuum 59 (2000) 845–853.

Adler, D.; Moss, S.C., Amorphous memories and bistable switches, J. Vac. Sci. Technol. 9 (1972) 1182–1189.

Adler, D.; Henisch, H.K.; Mott, S.N., The mechanism of threshold switching in amorphous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.

Afifi,M.A.; Labib, H.H.; Fouad, S.S.; El–Shazly, A.A., Electrical & thermal conductivity of the amorphous semiconductor GexSe1–x, Egypt, J. Phys. 17 (1986) 335–342.

Alekperova, Sh.M.; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Baranovskii, S.D.; Cordes, H., On the conduction mechanism in ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe5I: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M–Ag2Se–M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Kettaf, M.; Conan, A., Transition from S–to N–type differential negative resistance in Al–Al2O3–Ag2–xSe1+x thin film structures, Phys. Stat. Sol. (a) 74 (1982) 217–224,*.

Bondarev, V.N.; Pikhitsa, P.V., A dendrite model of current instability in RbAg4I5, Solid State Ionics 70/71 (1994) 72–76.

Boolchand, P., The maximum in glass transition temperature (Tg) near x=1/3 in GexSe1–x Glasses, Asian Journal of Physics (2000) 9, 709–72.

Boolchand, P.; Bresser, W.J., Mobile silver ions and glass formation in solid electrolytes, Nature 410 (2001) 1070–1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structural origin of broken chemical order in a GeSe2 glass, Phys. Rev. B 25 (1982) 2975–2978.

Boolchand, P., Grothaus, J.; Phillips, J.C., Broken chemical order and phase separation in GexSe1–x glasses, Solid state comm. 45 (1983) 183–185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221–0030.

Boolchand, P.; Grothaus, J, Molecular Structure of Melt-Quenched GeSe2 and GeS2 glasses compared, Proc. Int. Conf. Phys. Semicond. (Eds. Chadi and Harrison) $17^{th}$ (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P.; de Neufville, J.P, Intrinsically broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase separation and cluster size in GeSe2 glass, Hyperfine Interactions 27 (1986) 389–392.

Cahen, D.; Gilet, J.–M.; Schmitz, C.; Chernyak, L.; Gartsman, K.; Jakubowicz, A., Room–Temperature, electric field induced creation of stable devices in CuInSe2 Crystals, Science 258 (1992) 271–274.

Chatterjee, R.; Asokan, S.; Titus, S.S.K., Current–controlled negative–resistance behavior and memory switching in bulk As–Te–Se glasses, J. Phys. D: Appl. Phys. 27 (1994) 2624–2627.

Chen, C.H.; Tai, K.L. , Whisker growth induced by Ag photodoping in glassy GexSe1–x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non–Cryst. Solids 198–200 (1996) 829–832.

El Bouchairi, B.; Bernede, J.C.; Burgaud, P., Properties of Ag2–xSe1+x/n–Si diodes, Thin Solid Films 110 (1983) 107–113.

El Gharras, Z.; Bourahla, A.; Vautier, C., Role of photoinduced defects in amorphous GexSe1–x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5 thin films from "in situ" resistance measurements vs time, Phys. Stat. Sol. (a) 123 (1991) 451–460.

El–kady, Y.L., The threshold switching in semiconducting glass Ge21Se17Te62, Indian J. Phys. 70A (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of Ge20BixSe80–x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El–Shair, H.T., Electrical, thermal and optical properties of Se75Ge7Sb18, Vacuum 43 (1992) 253–257.

Feng, X. ;Bresser, W.J.; Boolchand, P., Direct evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.–P.; Rouxel, T.; Keryvin, V.; Sangleboeuf, J.–C.; Serre, I.; Lucas, J., Indentation creep of Ge–Se chalcogenide glasses below Tg: elastic recovery and non–Newtonian flow, J. Non–Cryst. Solids 298 (2002) 260–269.

Guin, J.–P.; Rouxel, T.; Sangleboeuf, J.–C; Melscoet, I.; Lucas, J., Hardness, toughness, and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the structure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen, A.E., Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal–a–Si:H–metal thin film structures, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan. J. Appl. Phys. 13 (1974) 1163–1164.

Hegab, N.A.; Fadel, M.; Sedeek, K., Memory switching phenomena in thin films of chalcogenide semiconductors, Vacuum 45 (1994) 459–462.

Hirose, Y.; Hirose, H., Polarity–dependent memory switching and behavior of Ag dendrite in Ag–photodoped amorphous As2S3 films, J. Appl. Phys. 47 (1976) 2767–2772.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1–x around the stiffness threshold composition, J. Optoelectronics and Advanced Materials 3 (2001) 199–214.

Hu, J.; Snell, A.J.; Hajto, J.; Owen, A.E., Constant current forming in Cr/p+a–Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B. 74 (1996) 37–50.

Hu, J.; Snell, A.J.; Hajto, J.; Owen, A.E., Current–induced instability in Cr–p+a–Si:H–V thin film devices, Phil. Mag. B 80 (2000) 29–43.

Iizima, S.; Sugi, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 & 36 (1980) 1061–1066.

Iyetomi, H.; Vashishta, P.; Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull. 8 (1973) 433–442.

Kaplan, T.; Adler, D., Electrothermal switching in amorphous semiconductors. J. Non–Cryst. Solids 8–10 (1972) 538–543.

Kawaguchi, T.; Maruno, S.; Elliott, S.R., Optical, electrical, and structural properties of amorphous Ag–Ge–S and Ag–Ge–Se films and comparison of photoinduced and thermally induced phenomena of both systems, J. Appl. Phys. 79 (1996) 9096–9104.

Kawaguchi, T.; Masui, K., Analysis of change in optical transmission spectra resulting from Ag photodoping in chalcogenide film, Japn. J. Appl. Phys. 26 (1987) 15–21.

Kawasaki, M.; Kawamura, J.; Nakamura, Y.; Aniya, M., Ionic conductivity of Agx(GeSe3)1–x (0<=x<=0.571) glasses, Solid state Ionics 123 (1999) 259–269.

Kluge, G.; Thomas, A.; Klabes, R.; Grotzschel, R., Silver photodiffusion in amorphous GexSe100–x, J. Non–Cryst. Solids 124 (1990) 186–193.

Kolobov, A.V., On the origin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Korkinova, Ts.N.; Andreichin,R.E., Chalcogenide glass polarization and the type of contacts, J. Non–Cryst. Solids 194 (1996) 256–259.

Kotkava, M.F.; Afif, M.A.; Labib, H.H.; Hegab, N.A.; Abdel–Aziz, M.M., Memory switching in amorphous GeSeTl chalcogenide semiconductor films, Thin Solid Films 240 (1994) 143–146.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16–19.

Lal, M.; Goyal, N., Chemical bond approach to study the memory and threshold switching chalcogenide glasses, Indian Journal of pure & appl. phys. 29 (1991) 303–304.

Leimer, F.; Stotzel, H.; Kottwitz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in GexSe1-x glass, Appl. Phys. Lett. 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2–V2O5 based glasses, Journal de Physique IV 2 (1992) C2–185 –C2–188.

Messoussi, R.; Bernede, J.C.; Benhida, S.; Abachi, T.; Latef, A., Electrical characterization of M/Se structures (M=Ni, Bi), Mat. Chem. And Phys. 28 (1991) 253–258.

Mitkova, M.; Boolchand, P., Microscopic origin of the glass forming tendency in chalcogenides and constraint theory, J. Non–Cryst. Solids 240 (1998) 1–21.

Mitkova, M.; Kozicki, M.N., Silver incorporation in Ge–Se glasses used in programmable metallization cell devices, J. Non–Cryst. Solids 299–302 (2002) 1023–1027.

Mitkova, M.; Wang, Y.; Boolchand, P., Dual chemical role of Ag as an additive in chalcogenide glasses, Phys. Rev. Lett. 83 (1999) 3848–3851.

Miyatani, S.-y., Electronic and ionic conduction in (AgxCu1-x)2Se, J. Phys. Soc. Japan 34 (1973) 423–432.

Miyatani, S.-y., Electrical Properties of Ag2Se, J. Phys. Soc. Japan 13 (1958) 317.

Miyatani, S.-y., Ionic conduction in beta–Ag2Te and beta–Ag2Se, Journal Phys. Soc. Japan. 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalcogenide glases, Jpn. J. Appl. Phys. 39 (2000) 6157–6161.

Nang, T.T.; Okuda, M.; Matsushita, T.; Yokota, S.; Suzuki, A., Electrical and optical parameters of GexSe1-x amorphous thin films, Jap. J. App. Phys. 15 (1976) 849–853.

Narayanan, R.A.; Asokan, S.; Kumar, A., Evidence concerning the effect of topology on electrical switching in chalcogenide network glasses, Phys. Rev. B 54 (1996) 4413–4415.

Neale, R.G.; Aseltine, J.A., The application of amorphous materials to computer memories, IEEE transactions on electron dev. Ed-20 (1973) 195–209.

Ovshinksy S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–induced structural and physico–chemical changes in amorphous chalcogenide semiconductors, Phil. Mag. B 52 (1985) 347–362.

Owen, A.E.; Le Comber, P.G.; Hajto, J.; Rose, M.J.; Snell, A.J., Switching in amorphous devices, Int. J. Electronics 73 (1992) 897–906.

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I.; Geller, I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge–As–Te glasses, J. Phys. D: Appl. Phys. 29 (1996) 2004–2008.

Rahman, S.; Sivarama Sastry, G., Electronic switching in Ge–Bi–Se–Te glasses, Mat. Sci. and Eng. B12 (1992) 219–222.

Ramesh, K.; Asokan, S.; Sangunni, K.S.; Gopal, E.S.R., Electrical Switching in germanium telluride glasses doped with Cu and Ag, Appl. Phys. A 69 (1999) 421–425.

Rose,M.J.;Hajto,J.;Lecomber,P.G.;Gage,S.M.;Choi,W.K.; Snell,A.J.;Owen,A.E., Amorphous silicon analogue memory devices, J. Non–Cryst. Solids 115 (1989) 168–170.

Rose,M.J.;Snell,A.J.;Lecomber,P.G.;Hajto,J.;Fitzgerald, A.G.;Owen,A.E., Aspects of non–volatility in a –Si:H memory devices, Mat. Res. Soc. Symp. Proc. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh, B., Electrical conductivity measurements of evaporated selenium films in vacuum, Proc. Indian Natn. Sci. Acad. 46, A, (1980) 362–368.

Sharma, P., Structural, electrical and optical properties of silver selenide films, Ind. J. Of pure and applied phys. 35 (1997) 424–427.

Snell, A.J.; Lecomber, P.G.; Hajto, J.; Rose, M.J.; Owen, A.E.; Osborne, I.L., Analogue memory effects in metal/a–Si:H/metal memory devices, J. Non–Cryst. Solids 137–138 (1991) 1257–1262.

Snell, A.J.; Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon, A.G., Microfilaments in amorphous chalcogenide memory devices, J. Phys. D: Appl. Phys. 8 (1975) L120–L122.

Steventon, A.G., The switching mechanisms in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenide, Journal(??) (1972) 4609–4612.

Tichy, L.; Ticha, H., Remark on the glass–forming ability i GexSe1–x and AsxSe1–x systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (1993) 14650–14652.

Tranchant,S.;Peytavin,S.;Ribes,M.;Flank,A.M.;Dexpert, H.;Lagarde,J.P., Silver chalcogenide glasses Ag–Ge–Se: Ionic conduction and exafs structural investigation, Transport–structure relations in fast ion and mixed conductors Proceedings of the 6th Riso International symposium. Sep. 9–13, 1985.

Tregouet, Y.; Bernede, J.C., Silver movements in Ag2Te thin fims: switching and memory effects, Thin Solid Films 57 (1979) 49–54.

Uemura, O.; Kameda, Y.; Kokai, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Griener, J.D.; Raghavan, K.S., Electric field induced filament formation in As–Te–Ge glass, J. Non–Cryst. Solids 2 (1970) 358–370.

Viger, C.; Lefrancois, G.; Fleury, G., Anomalous behaviour of amorphous selenium films, J. Non–Cryst. Solids 33 (1976) 267–272.

Vodenicharov, C.; Parvanov,S.; Petkov,P., Electrode–limited currents in the thin–film M–GeSe–M system, Mat. Chem. And Phys. 21 (1989) 447–454.

Wang, S.–J.; Misium, G.R.; Camp, J.C.; Chen, K.–L.; Tigelaar, H.L., High–performance Metal/silicide antifuse, IEEE electron dev. Lett. 13 (1992)471–472.

Weirauch, D.F., Threshold switching and thermal filaments in amorphous semiconductors, App. Phys. Lett. 16 (1970) 72–73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971–2974.

West, W.C., Electrically erasable non–volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non–Cryst. Solids 151 (1992) 149–154.

* cited by examiner

APPARATUS AND METHOD FOR DUAL CELL COMMON ELECTRODE PCRAM MEMORY DEVICE

This application is a divisional of application Ser. No. 09/938,672, filed on Aug. 27, 2001, now U.S. Pat No. 6,737,312 which is incorporated herein by reference.

FIELD OF THE INVENTION

The present invention relates to a PCRAM device which utilizes a chalcogenide glass memory cell to store a memory state. More particularly, the invention relates to a way of fabricating memory cells in a PCRAM memory device to increase packing density.

BACKGROUND OF THE INVENTION

Recently chalcogenide glasses fabricated as fast ion conductors have been investigated as data storage memory cells for use in memory devices, such as DRAM memory devices. U.S. Pat. Nos. 5,761,115, 5,896,312, 5,914,893, and 6,084,796 all describe this technology and are incorporated herein by reference. The storage cells are called programmable metallization cells, also known as PCRAM cells. One characteristic of such a cell is that it typically includes a fast ion conductor such as a chalcogenide metal ion and a cathode and anode spaced apart on a surface of the fast ion conductor. Application of a voltage across the cathode and anode causes growth of a non-volatile metal dendrite which changes the resistance and capacitance of the cell which can then be used to store data.

For this technology to be used on a mass scale in memory devices it is necessary to fabricate large numbers of memory cells in a relatively small amount of integrated surface area.

SUMMARY OF THE INVENTION

The present invention provides a fabrication process and resulting structure which stacks at least two programmable metallization cells vertically in an integrated circuit. The cells can be accessed individually to provide vertical storage of two data bits in a given area of the integrated circuit.

BRIEF DESCRIPTION OF THE DRAWINGS

The foregoing and other features and advantages of the invention will become more apparent from the detailed description of the exemplary embodiments of the invention given below with reference to the accompanying drawings in which.

DETAILED DESCRIPTION OF THE PREFERRED EMBODIMENTS

The present invention provides two stacked PCRAM cells which use a common anode located between them. The two stacked memory cells can be accessed separately to store two bits of data which can be read and written. In an exemplary embodiment, the two memory cells are stacked one over the other with a common anode between them to form an upper and lower cell pair. Respective access transistors are provided for the cells and arranged to permit reading and writing of the cells.

Figure 1:
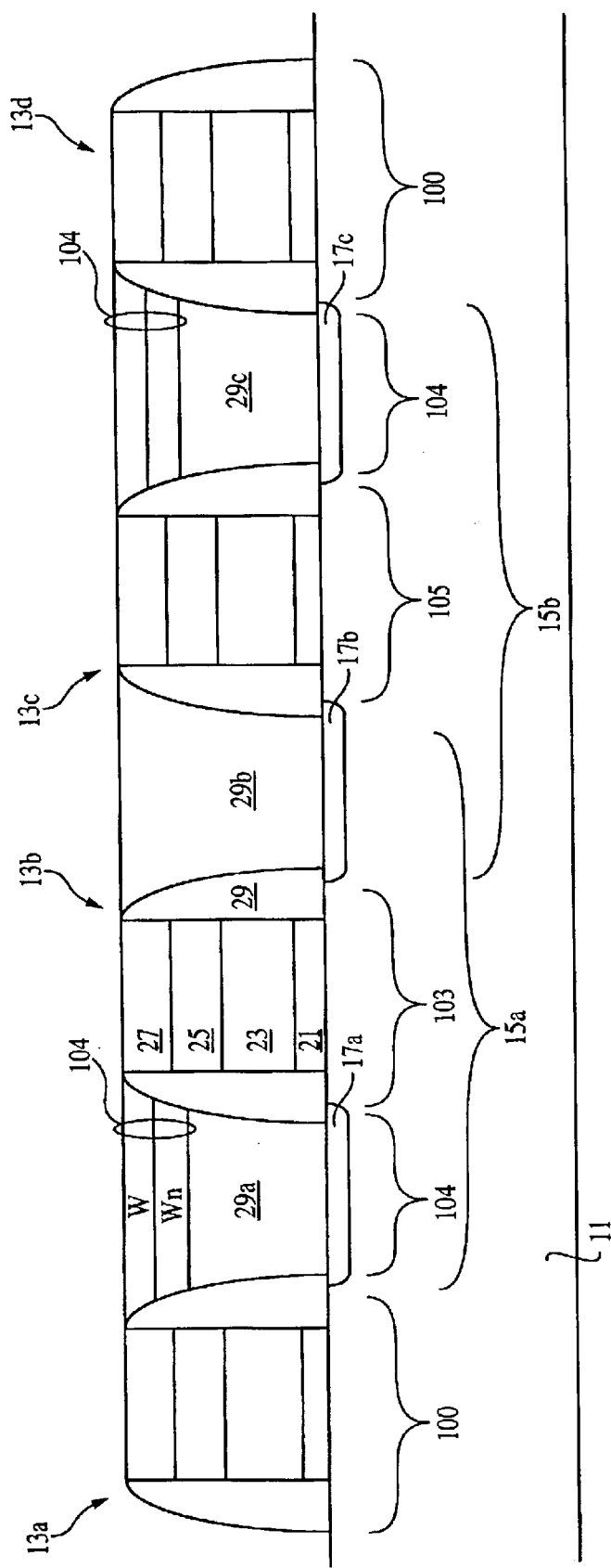
FIG. 1 shows early steps in the fabrication of a PCRAM cell of the present invention.

FIG. 1 shows a substrate 11 having a doped well over which the memory cells are formed. The substrate can be formed of any semiconductor material with silicon being exemplary. The substrate 11 has fabricated thereon a plurality of gate stacks, two of which (13b and 13c) are part of MOSFET access transistors 15a and 15b for lower memory cells of the stacked pairs of cells. Transistors 15a and 15b have associated source/drain doped regions 17a, 17b, and 17c. The gate stacks each contain an oxide layer, e.g. a silicon oxide layer 21, in contact with substrate 11, a conductor layer 23 formed of, for example, polysilicon, a conductive silicon layer 25 and a cap insulating layer 27 formed of, for example, silicon nitride. Insulating sidewall spacers 29 of, for example, silicon nitride are also provided. The material composition of the various layers and sidewalls of the gate stacks is not critical as other well known materials used to form the components of a transistor gate stack may also be used.

As noted, FIG. 1 illustrates the early stages of the fabrication of a pair of stacked memory cells in accordance with the present invention, which begins at the point where three polysilicon plugs 29a, 29b, and 29c have been formed between gate stacks 13a–13b, 13b–13c, and 13c–13d. The outer gate stacks 13a and 13d are adjacent rowlines for other access areas in the memory array, located on top of field isolation areas 100. Additionally, FIG. 1 shows multilayer cathodes 104 formed on plugs 29a and 29c. The cathodes 104 are formed using a composite conductive layered stack such as a two layer stack, for example, of tungsten nitride (Wn) and tungsten (W) which are blanket deposited and then patterned by CMP and/or etching. The two layer stack can also be made of other conductive materials such as platinum (Pt), titanium (Ti), cobalt (Co), aluminum (Al) and nickel (Ni).

Figure 2:
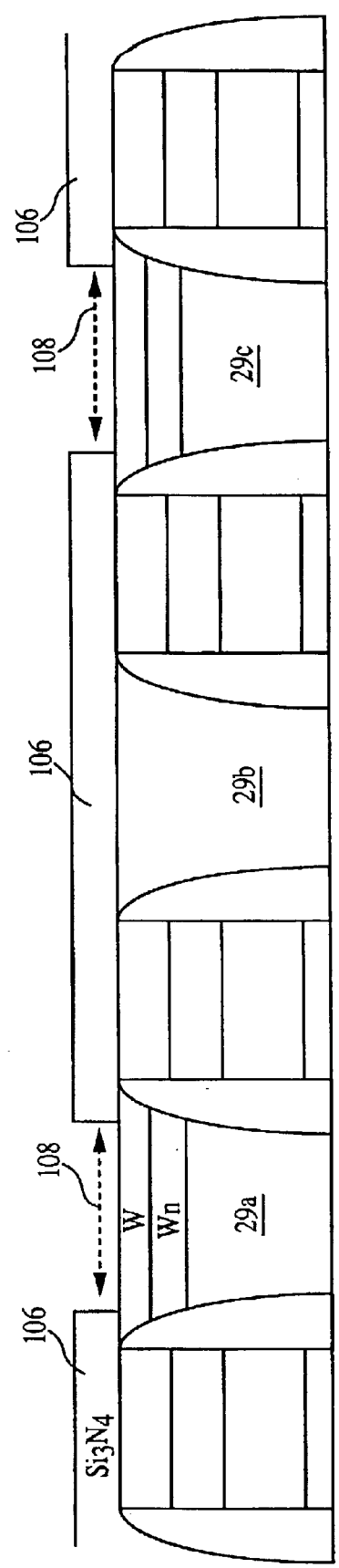
FIG. 2 shows the fabrication steps for a PCRAM cell of the present invention subsequent to those shown in FIG. 1.
Figure 3:
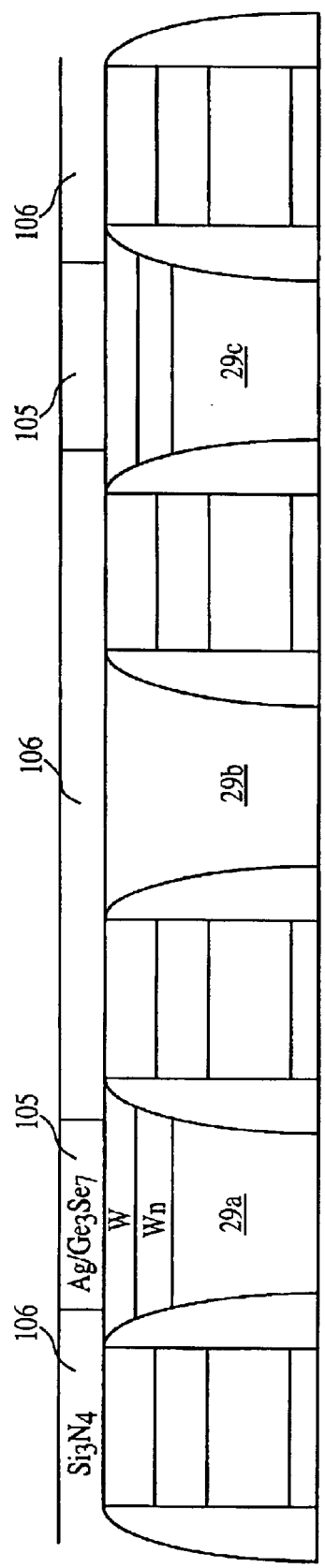
FIG. 3 shows fabrication steps for the PCRAM cell of the present invention subsequent to those shown in FIG. 2.

As shown in FIG. 2, an insulator layer 106 of, e.g. silicon nitride ($Si_3N_4$) is formed over the FIG. 1 structure and is patterned to form holes 108 over each cathode 104. A layer of chalcogenide glass is next deposited over the FIG. 2 structure and planarized, as shown in FIG. 3, leaving areas of chalcogenide material 105 over the cathodes 104. The chalcogenide glass may be formed as an $Ag/Ge_3Se_7$ material, or other chalcogenide glass compositions which have a fast ion conductor and are capable of growing a dendrite in the presence of an applied voltage. Alternatively, other glass materials responsive to applied voltages to write and send information can also be used.

Figure 4:
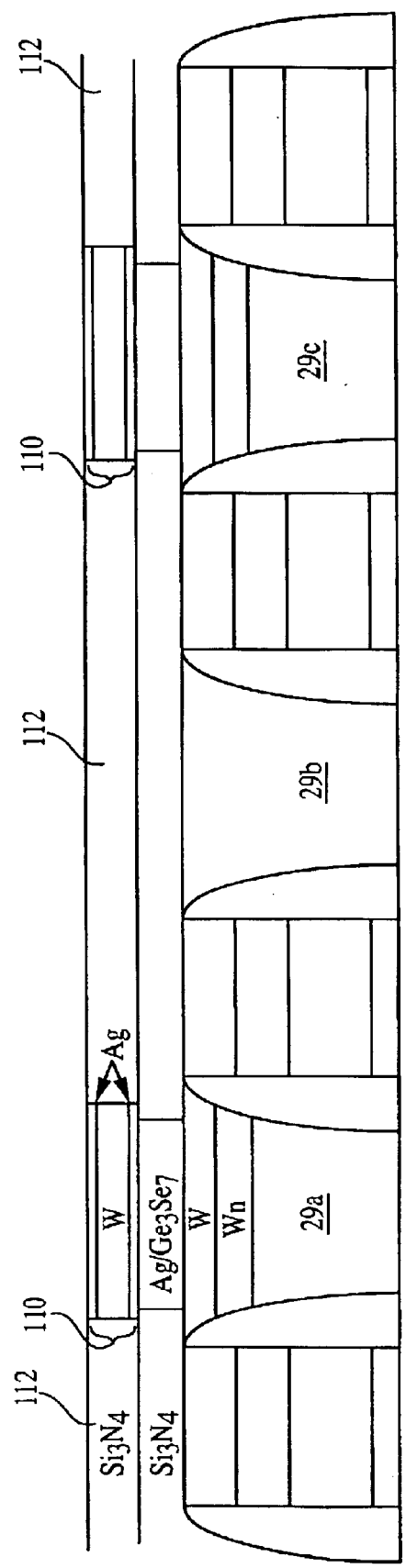
FIG. 4 shows fabrication steps for the PCRAM cell of the present invention subsequent to those shown in FIG. 3.

Another insulating layer 112 of, for example, silicon nitride is then formed over the FIG. 3 structure, and is patterned to form openings over the chalcogenide glass areas. An Ag/W/Ag conductive stack, for example, is then formed in the openings, as shown in FIG. 4. This conductive stack combination serves as a anode 110 for the lower memory cell 118 formed by the cathode 104, chalcogenide glass 105, and anode 110, and serves as the anode for an upper memory cell, the formation of which is described below. The Ag/W/Ag stack 114 may be fabricated across a memory cell array. Electrical connections to the stacks 114 can be made at the periphery contact holes of a memory cell array.

Figure 5:
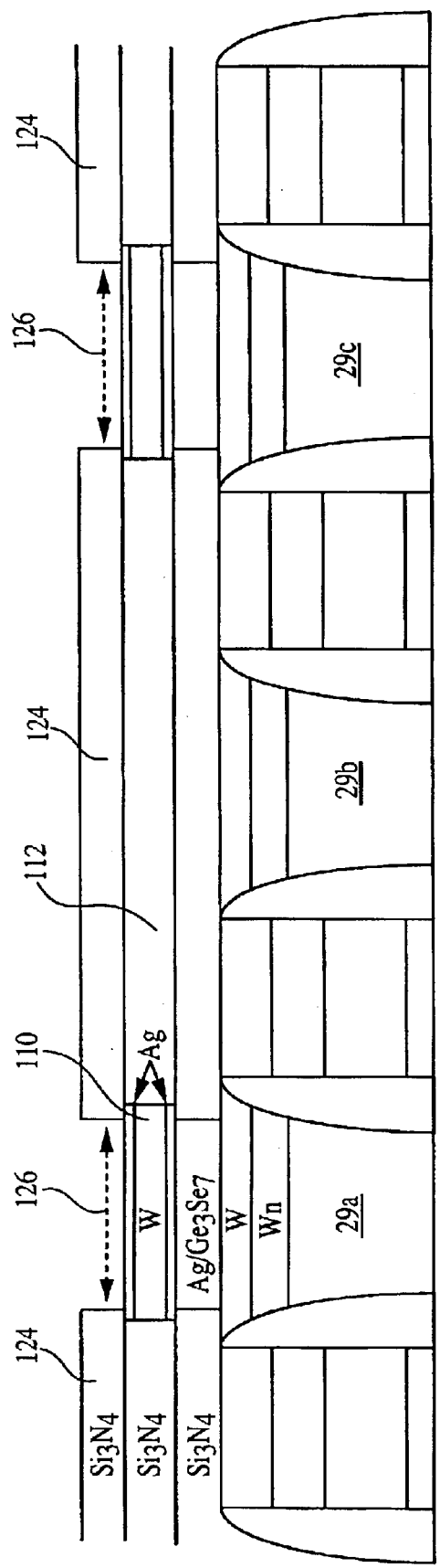
FIG. 5 shows fabrication steps for the PCRAM cell of the present invention subsequent to those shown in FIG. 4.
Figure 6:
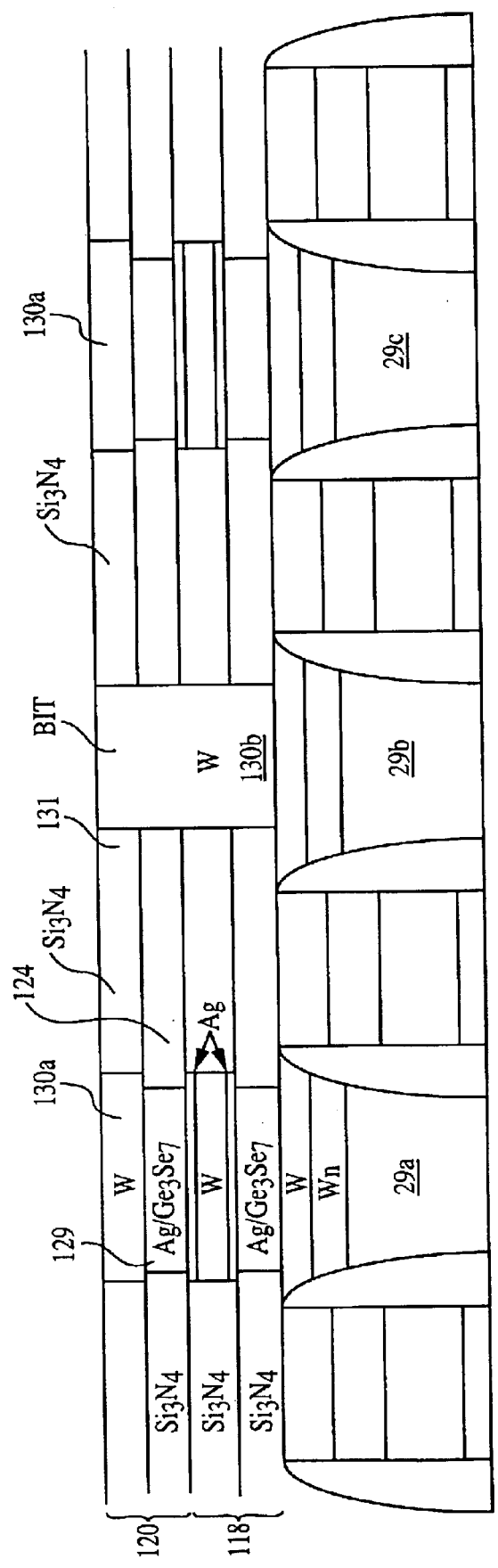
FIG. 6 shows fabrication steps for the PCRAM cell of the present invention subsequent to those shown in FIG. 5.

In the next stage of fabrication, show in FIG. 5, another insulating layer 124, for example, silicon nitride, is deposited and patterned to form holes 126 over the anodes 110. A silver and chalcogenide glass layer 128 is then deposited with the holes 126 and planarized. As with layer 105, the chalcogenide glass may be formed as an $Ag/Ge_3Se_7$ material, or other chalcogenized glass compositions, which are capable of focusing a conductive path in the presence of an applied voltage or other glass compositions which can be used to write or read data may also be used. As also shown in FIG. 6, another insulating layer 131 is deposited and patterned to form holes and a conductor 130, such as tungsten, is then deposited in the holes in contact with chalcogenide glass layer 128. A layer of tungsten 130b is also deposited in a hole provided in layer 131 over polysilicon plug 29b. The tungsten electrodes 130a serve as cathodes 132 for the upper chalcogenide glass memory cell 120 formed by common anode 110 and chalcogenide layer 129. Unlike cathodes 104, cathodes 132 are formed solely from tungsten. Additional fabrication steps can now be used to connect cathodes 132 to respective access transistors similar to transistors 15a, 15b and formed elsewhere in the memory cell array.

Figure 7:
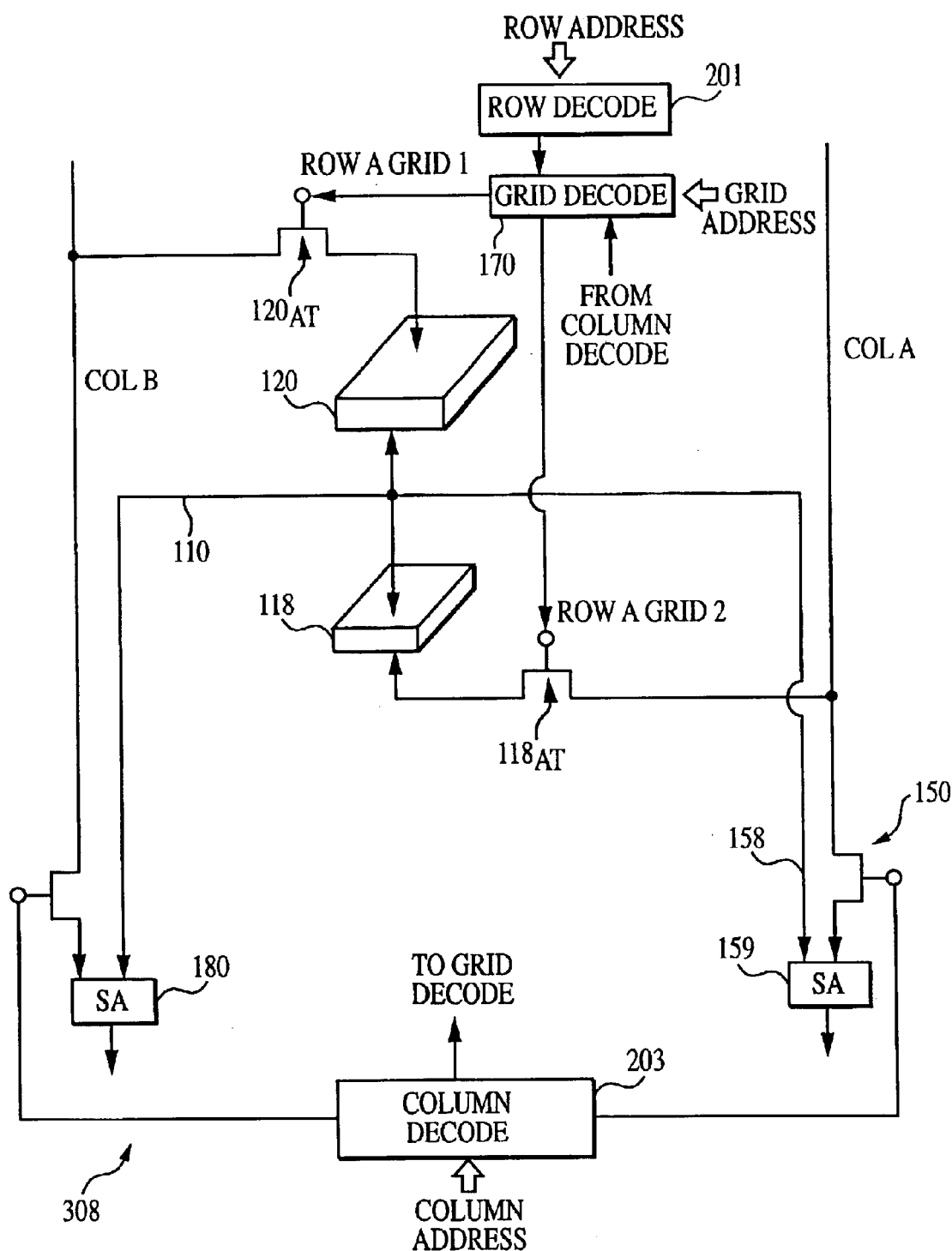
FIG. 7 illustrates an exemplary PCRAM cell accessing circuit.

FIG. 7 shows a simplified electrical schematic diagram of the upper and lower memory cells 118, 120 as incorporated within a memory cell array 308. Lower memory cell 118 and upper memory cell 120 are each connected to respective access transistors $118_{AT}$ and $120_{AT}$. The transistor $118_{AT}$ of FIG. 7 corresponds to the access transistor 15a of FIG. 1. Transistor $120_{AT}$ is a similar access transistor fabricated in the memory array, preferably close to the access transistor $118_{AT}$.

The specific binary values stored within the memory cells 118, 120 of the present invention is determined by respective sense amplifiers 159, 180. As shown in FIG. 7, the PCRAM system of the present invention locates those sense amplifiers 159 and 180 in the periphery of the memory array of the present invention. Using memory cell 118 as an example, a sense amplifier 159 has one input tied to the common anode 110, and the other input tied to the access transistor $118_{AT}$ device through a column line A through a transistor 150. The access transistor $118_{AT}$ is connected to a wordline and allows charge to move from the memory cell 118 to the sense amplifier 159 when both row and columns associated with cells 118, 120 are selected, and the lower cell 118 is selected. As an alternative to being tied to common anode 110, the input 158 of sense amplifier 159 can instead be tied to a reference signal which may be another inactive column line.

Each memory cell pair 118, 120 within the memory array 308 is selected by row and column address signals as is well known in the memory art. To this end, FIG. 7 shows a row decoder 201 and a column decoder 203, which are used to select a row and column associated with a cell pair 118, 120. However, it is still necessary to determine whether the upper or lower member of a cell pair is being addressed. Thus a third decoder, termed a grid decoder, is used to select one of several of the lower 118 and upper 120 memory cells for operation. Accordingly, a grid decoder 170, shown in FIG. 7, designates whether an upper or lower cell is being addressed. Depending on which of two grid addresses is specified the grid decoder 170 will activate a selected word line for transistor $118_{AT}$ or $120_{AT}$.

The process of reading a memory cell is accomplished by sensing the resistance value of each memory cell, since the storage of a 1 in a memory cell causes the resistance of the dendrite to be significantly larger than if a 0 is stored therein. By observing the output of the two sense amplifiers 159 and 180, all four binary conditions (00, 01, 10, 11) of the cell pairs can be determined.

Again referring to FIG. 7, when the access transistor $118_{AT}$ turns on, a sub-write threshold voltage is supplied to the cell 118. If the cell 118 is in a 'zero' state, a very small current will flow based on the intrinsic resistance of the non written cell, and the sense amplifiers will register a "no current" condition with respect to a reference. If a 'one' has been written to the cell, a much larger current will flow, which will be detected by sense amplifier 159. An alternative to the current differential sense amplifier 159 described above is the use of a voltage detector for sense amplifiers 159, 180.

Although FIG. 7 shows access transistor $120_{AT}$ connecting the upper memory cell 120 to a column line B, separate from column line A, since the memory cells 118, 120 are never accessed at the same time, access transistors can also be configured to couple the upper memory cell 120 to column line A. The use of a separate column line B for the upper memory cell 128, however, would enable both cells to be accessed at the same time to simultaneously store and retrieve two bits of data. In such a case the grid decoder can be omitted.

Figure 8:
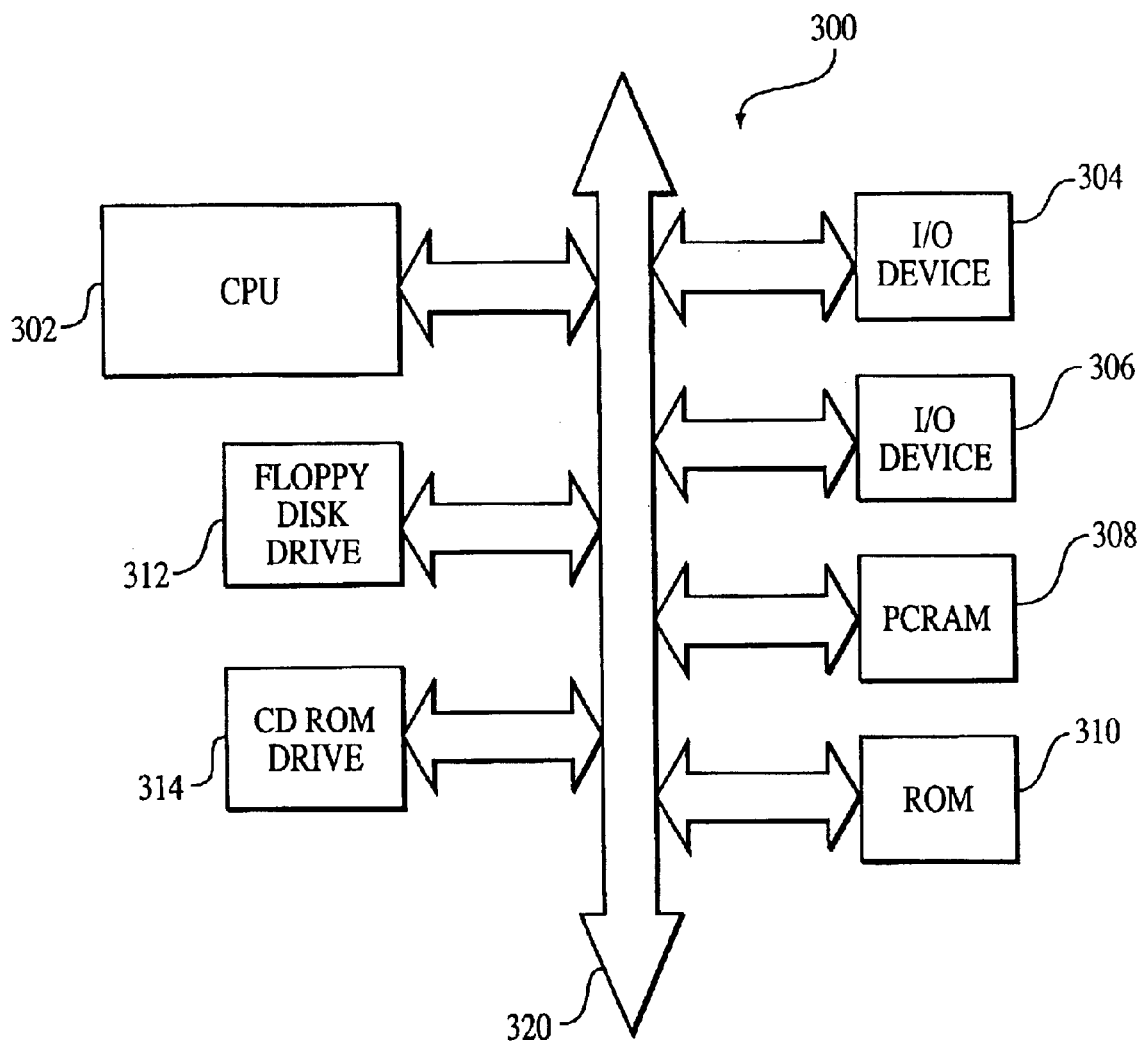
FIG. 8 shows how the present invention can be incorporated into a computer.

FIG. 8 is a block diagram of a processor-based system 300 utilizing a PCRAM memory cell and array constructed in accordance with the invention as incorporated within a PCRAM memory device 308. The processor-based system 300 may be a computer system, a process control system or any other system employing a processor and associated memory. The system 300 includes a central processing unit (CPU) 302, e.g., a microprocessor, that communicates with the PCRAM memory device 308 and an I/O device 304 over a bus 320. It must be noted that the bus 320 may be a series of buses and bridges commonly used in a processor-based system, but for convenience purposes only, the bus 320 has been illustrated as a single bus. A second I/O device 306 is illustrated, but is not necessary to practice the invention. The processor-based system 300 also includes read-only memory (ROM) 310 and may include peripheral devices such as a floppy disk drive 312 and a compact disk (CD) ROM drive 314 that also communicates with the CPU 302 over the bus 320 as is well known in the art. The CPU 302 and PCRAM memory device 308 also may be fabricated on the same chip.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A memory device comprising:
    a first memory cell comprising a chalcogenide glass material between a first electrode and a second electrode; and
    a second memory cell comprising a chalcogenide glass material between said second and a third electrode;
    wherein said second electrode comprises a first silver layer, a tungsten layer over said first silver layer, and a second silver layer over said tungsten layer.

2. A memory device as in claim 1, wherein said first memory cell is vertically stacked with said second memory cell.

3. A memory device as in claim 2, wherein said stacked first and second memory cells are provided over a conductive plug such that a cathode of one of said first and second memory cells is in electrical contact with said conductive plug.

4. A memory device as in claim 3, further comprising a first access transistor electrically coupled to one of said first and second memory cells, said conductive plug being in contact with a first active region of said access transistor.

5. A memory device as in claim 4, wherein a second active region of said first access transistor is electrically coupled to a column line conductor.

6. A memory device as in claim 5, wherein a gate of said first access transistor is connected to a word line conductor.

7. A memory device as in claim 4, further comprising a second access transistor electrically coupled to said first or second memory cell not electrically coupled to said first access transistor.

8. A memory device as in claim 7, further comprising a circuit configured to operate said first and second access transistors separately to individually access each of said first and second memory cells.

9. A memory device as in claim 7, further comprising a circuit configured to operate said first and second access transistors together to simultaneously access said first and second memory cells.

10. A memory device as in claim 2, wherein said first and second memory cells are electrically coupled to different column lines.

11. A memory device as in claim 2, wherein said first and second memory cells are electrically coupled to a same column line.

12. A memory device as in claim 1, wherein said first and second memory cells each comprise germanium selenide.

13. A memory device as in claim 2, wherein said germanium selenide has the stoichiometry $Ge_xSe_{100-x}$.

14. A memory device as in claim 1, wherein each of said first and second electrodes comprises a layer of tungsten, platinum, titanium, cobalt, aluminum, or nickel.

15. A memory device as in claim 1, wherein said second electrode is a common anode.

16. A memory device as in claim 1, wherein said chalcogenide glass material of said first and second memory cells incorporates silver.

17. A computer system comprising:

a processor;

a memory device electrically coupled to said processor, said memory device comprising:

a first memory cell comprising a chalcogenide glass material between a first electrode and a second electrode; and a second memory cell comprising a chalcogenide glass material between said second electrode and a third electrode;

wherein said second electrode comprises a first silver layer, a tungsten layer over said first silver layer, and a second silver layer over said tungsten layer.

18. A computer system as in claim 17, wherein said first memory cell and said second memory cell are vertically stacked.

19. A computer system as in claim 18, wherein said vertically stacked first and second memory cells are provided over a conductive plug such that a cathode of one of said first and second memory cells is in electrical contact with said conductive plug.

20. A computer system as in claim 19, further comprising a first access transistor electrically coupled to one of said first and second memory cells, said conductive plug being in contact with a first active region of said access transistor.

21. A computer system as in claim 20, wherein a second active region of said first access transistor is electrically coupled to a column line.

22. A computer system as in claim 21, wherein a gate of said first access transistor is connected to a word line.

23. A computer system as in claim 20, further comprising a second access transistor electrically coupled to the first and second memory cell not electrically coupled to said first access transistor.

24. A memory device as in claim 23, further comprising a circuit configured to operate said first and second access transistors together to simultaneously access both first and second memory cells.

25. A computer system as in claim 18, wherein said first and second memory cells are coupled to different column lines.

26. A computer system as in claim 18, wherein said first and second memory cells are connected to a same column line.

27. A computer system as in claim 26, further comprising a circuit configured to operate said first and second access transistors separately to individually access each of said first and second memory cells.

28. A computer system as in claim 17, wherein said second electrode is an anode of said first and second memory cells.

29. A computer system as in claim 17, wherein each of said first and third electrodes comprises a layer of tungsten, platinum, titanium, cobalt, aluminum, or nickel.

30. A computer system as in claim 17, wherein said chalcogenide glass material of said first and second memory cells comprises germanium selenide.

31. A computer system as in claim 30, wherein said germanium selenide has the stoichiometry $Ge_xSe_{100-x}$.

32. A memory device as in claim 17, wherein said chalcogenide glass material of said first and second memory cells incorporates silver.

* * * * *